United States Patent [19]
Iwata

[11] Patent Number: 5,914,526
[45] Date of Patent: Jun. 22, 1999

[54] SEMICONDUCTOR DEVICE

[75] Inventor: Hitoshi Iwata, Aichi-ken, Japan

[73] Assignee: Kabushiki Kaisha Tokai Rika Denki Seisakusho, Aichi-ken, Japan

[21] Appl. No.: 08/766,429

[22] Filed: Dec. 12, 1996

[30]     Foreign Application Priority Data

Dec. 14, 1995    [JP]    Japan ................................ 7-325728

[51] Int. Cl.⁶ .................................................. H01L 29/00
[52] U.S. Cl. ............................ 257/532; 257/379; 327/54
[58] Field of Search .................................. 257/532, 379; 327/54

[56]                 References Cited

U.S. PATENT DOCUMENTS 5,479,045  12/1995  Narahara et al. ..................... 257/532

*Primary Examiner*—Mark V. Prenty
*Attorney, Agent, or Firm*—Limbach & Limbach L.L.P.; Seong-Kun Oh

[57]                 ABSTRACT

A semiconductor device incorporating an operational amplifier having two input terminals. The device includes a semiconductor substrate, an insulation film formed on the semiconductor substrate and an element having first and second electrodes formed on the insulation film. The first and second electrodes are respectively connected to the two input terminals of the electronic circuit. The first electrode, the insulation film and the semiconductor substrate form a parasitic capacitor. The device also includes a third electrode formed on the insulation film. The third electrode is connected to the second electrode of the element.

10 Claims, 2 Drawing Sheets

SEMICONDUCTOR DEVICE

BACKGROUND OF THE INVENTION

1. Field of the Invention

The present invention relates generally to a semiconductor device. More particularly, the present invention relates to a semiconductor device that minimizes the incidence of malfunction caused by electromagnetic interference (EMI).

2. Description of the Related Art

When electromagnetic noise caused by EMI is mixed into a semiconductor circuit, the noise may cause the circuit to malfunction. In order to minimize the incidence of this malfunction, a capacitor, a coil or the like is often connected to the input line or the power line of an electronic circuit such as an operational amplifier, a micro computer or the like.

A capacitor or a coil is sometimes mounted on a printed circuit board with an operational amplifier. This increases the number of electronic parts mounted on the printed circuit board and enlarges the area for mounting the electronic parts.

Further, mounting a capacitor on a printed circuit board elongates the wiring for connecting the terminal of the capacitor and the input terminal of the operational amplifier. Electromagnetic noise is mixed into the operational amplifier via the wiring and may cause the operational amplifier to malfunction.

SUMMARY OF THE INVENTION

Broadly speaking, the present invention relates to a semiconductor device that minimizes the incidence of malfunction caused by mixing of electromagnetic noise.

To achieve the foregoing and other objectives and in accordance with the purpose of the present invention, an improved semiconductor device incorporating an electronic circuit having at least two input terminals is provided. The device includes a semiconductor substrate, an insulation film formed on the semiconductor substrate and an element having a first and a second electrodes and formed on the insulation film. The first and second electrodes are connected to the at least two input terminals of the electronic circuit, respectively. The first electrode, the insulation film and the semiconductor substrate form a parasitic capacitor. The device also includes a third electrode formed on the insulation film and connected to the second electrode of the element.

The third electrode, the insulation film and the semiconductor substrate may form an additional capacitor. The capacitance of the additional capacitor is substantially equal to the capacitance of the parasitic capacitor. Furthermore, the electronic circuit may include an operational amplifier having a non-inverted input terminal and an inverted input terminal. The first and second electrodes of the element are connected to the non-inverted input terminal and the inverted input terminal, respectively.

The present invention can be implemented in numerous ways, including as an apparatus and method.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with its objects and advantages thereof, may best be understood by reference to the following description of the presently preferred embodiments together with the accompanying drawings.

DETAILED DESCRIPTION OF THE PREFERRED EMBODIMENTS

A preferred embodiment of the present invention will now be described with reference to FIGS. 1 to 4.

Figure 1:
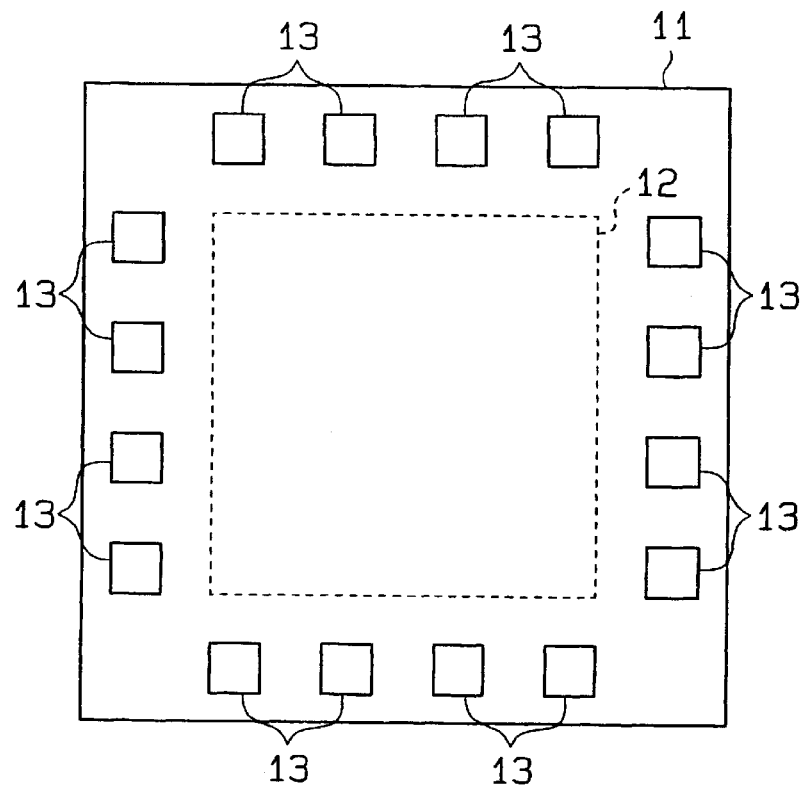
FIG. 1 is a diagrammatic plan view illustrating a semiconductor chip.

FIG. 1 is a diagrammatic plan view illustrating a semiconductor chip 11 serving as a semiconductor device. An active area 12 is defined on the central portion of the semiconductor chip 11. An electronic circuit (not shown) is located in the area 12. Formed around the active area 12 of the semiconductor chip 11 are a plurality of pads 13 electrically connected to the electronic circuit via wires (not shown). Each pad 13 is connected to a corresponding pad on a print circuit board through wire bonding. The electronic circuit in the active area 12 is thus electrically connected to another electronic circuit (not shown) on the print circuit board.

Figure 2:
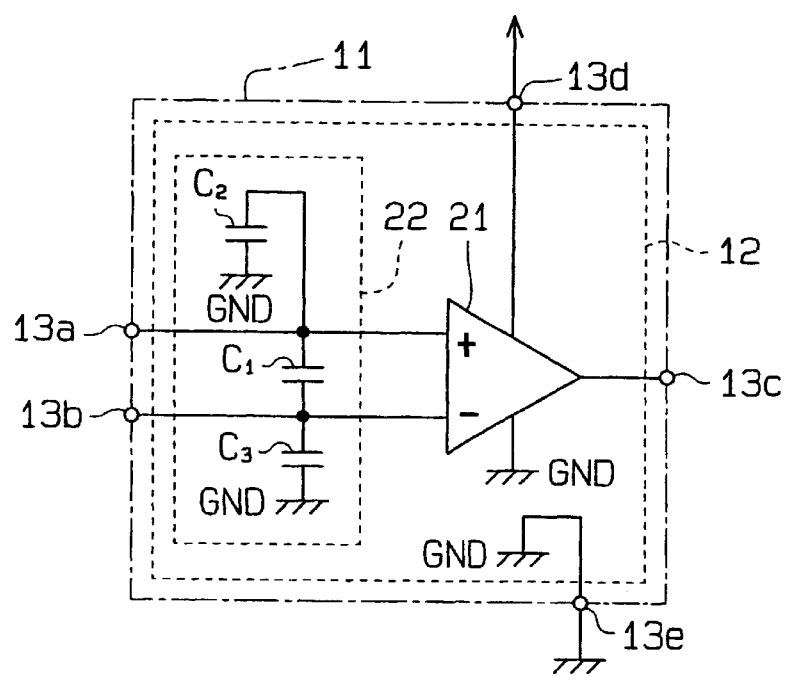
FIG. 2 is a circuit diagram illustrating an electronic circuit according to an embodiment of the present invention in an active area of the semiconductor chip shown in FIG. 1.

FIG. 2 is a circuit diagram illustrating a part of the electronic circuit in the active area 12. An operational amplifier 21 and a filter 22 are located in the area 12. The operational amplifier 21 includes a non-inverted input terminal connected to a pad (a first input terminal) 13a, an inverted input terminal connected to a pad (a second input terminal) 13b, an output terminal connected to a pad (an output terminal) 13c, a high potential power supply terminal connected to a pad (power supply terminal) 13d and a low potential power supply terminal connected to the ground GND. The pad 13d is connected to the high potential power supply. The ground GND is connected to an external low potential power supply (not shown) via the pad (power supply terminal) 13e.

A filter 22 is connected between the non-inverted input terminal and the inverted input terminal of the operational amplifier 21 and pads 13a, 13b. The filter 22 consists of capacitors $C_1$ to $C_3$. The filter 22 is located in the vicinity of the input terminals of the operational amplifier 21. The filter 22 minimize the electromagnetic noise mixed into the operational amplifier. The capacitor $C_1$ has a first terminal connected to the non-inverted input terminal of the operational amplifier 21 and a second terminal connected to the inverted input terminal of the amplifier 21. The capacitor $C_2$ has a first terminal connected to the non-inverted input terminal of the amplifier 21 and a second terminal connected to the ground GND. The capacitor $C_3$ has a first terminal connected to the inverted input terminal and a second terminal connected to the ground (GND).

The capacitors $C_1$ to $C_3$ are integrated in the active area 12 with the operational amplifier 21. That is, the capacitors $C_1$ to $C_3$ are formed in the semiconductor chip 11 and located in the vicinity of the terminals of the operational amplifier 21. Therefore, compared with the prior art structure in which a semiconductor chip and capacitors are separately mounted on a print circuit board, the structure of the present invention reduces the area for mounting electronic parts. Further, the length of wiring between the capacitors $C_1$ to $C_3$ and the terminals of the operational amplifier 21 is shorter than that of the prior art. This reduces electromagnetic noise mixed into the operational amplifier 21 via the wiring, thereby minimizing the incidence of malfunction in the operational amplifier 21.

Figure 3:
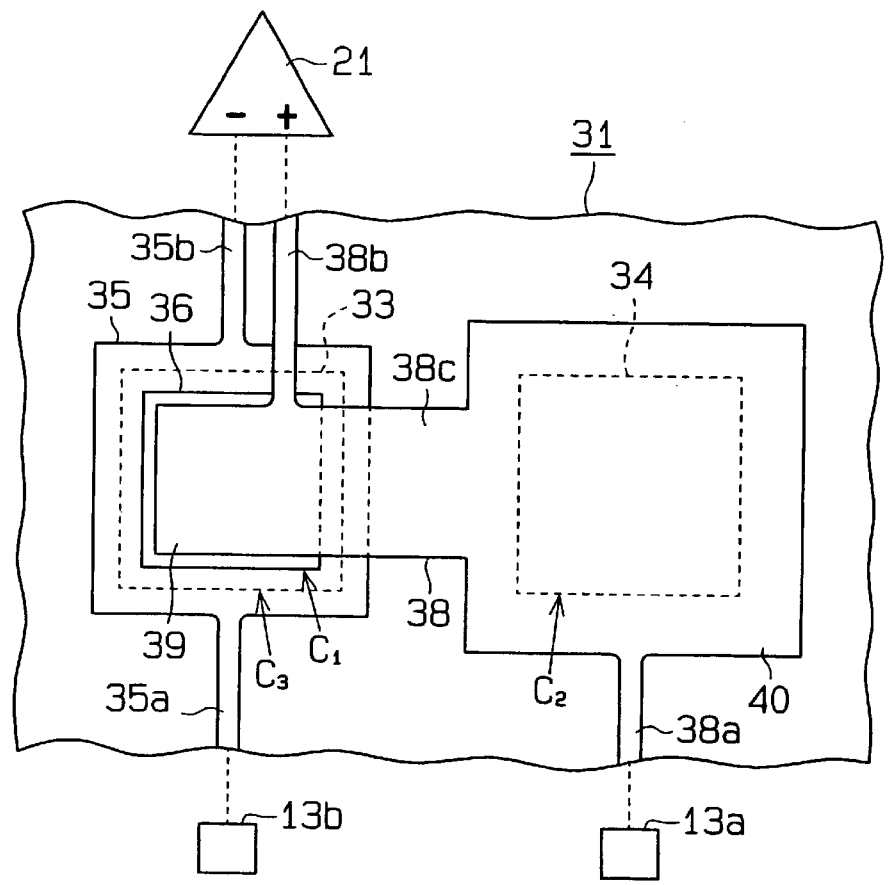
FIG. 3 is a plan view illustrating a filter in the electronic circuit in the semiconductor chip of FIG. 2.
Figure 4:
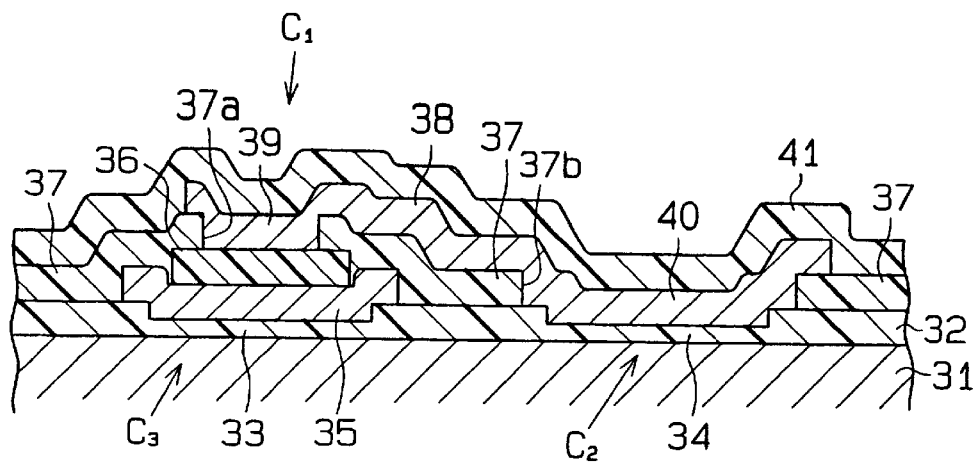
FIG. 4 a cross-sectional view illustrating the filter of the semiconductor in FIG. 3.

FIG. 3 is a partial plan view of the semiconductor chip 11 illustrating the filter 22. FIG. 4 is a partial cross-sectional view of the semiconductor chip 11 illustrating the filter 22.

In FIG. 4 the operational amplifier 21 (not shown) and the filter 22 are formed at predetermined locations on a semiconductor substrate 31, which is made of single crystal silicon. The substrate 31 is connected to the ground GND. An insulation film 32, which is formed through thermal oxidation and is made of silicon oxide ($SiO_2$), is located on the substrate 31. The insulation film 32 has square thin film portions 33, 34 having the same thickness and area. The thin film portions 33, 34 having a desired thickness are formed through, for example, thermal oxidation after etching a part of the insulation film 32.

A two layer structure first electrode 35 made of titanium (Ti) and platinum (Pt) is formed on the thin film portion 33 and partially covers the insulation film 32 at peripheral region of the thin film portion 33. Sputtering and electron beam (EB) deposition may be employed as a method for forming the first electrode 35. The thin film portion 33, which is thinner than the insulation film 32, is located between the first electrode 35 and the substrate 31 and serves as a dielectric having a predetermined dielectric constant. The first electrode 35, the thin film portion 33 and the substrate 31 form the capacitor $C_3$. Integrally formed with the first electrode 35 are a printed pattern 35a connected to the pad (the second input terminal) 13b and a printed pattern 35b connected to the inverted input terminal of the operational amplifier 21.

A high dielectric thin film 36 made of BST ($BaTiO_3$+$SrTiO_3$) is formed on the first electrode 35. The thin film 36 is formed through sputtering and spin coating of sol-gel material and drying and annealing followed by dry etching employing photo resist. An interlayer insulation film 37, which is formed through chemical-vapor deposition (CVD) and made of nitride film (SiN), is located on the insulation film 32. The interlayer insulation film 37 has a square opening 37a for exposing much of the high dielectric thin film 36 and another square opening 37b for exposing the thin film portion 34.

An aluminum electrode layer 38 is formed on the interlayer insulation film 37. A part of the layer 38 serves as the second electrode 39 that covers the high dielectric thin film 36, and another part serves as the third electrode 40 that covers the thin film portion 34. The high dielectric thin film 36 is located between the lower layer first electrode 35 and the upper layer second electrode 39. The thin film 36 has high dielectric constant ranging from hundreds to thousands. The first electrode 35, the high dielectric thin film 36 and the second electrode 39 form a capacitor $C_1$. The high dielectric is made of a material of a high dielectric constant and includes ferroelectric substance that voluntarily generates polarization without electric field applied thereto. The high dielectric includes BST ($BaTiO_3$+$SrTiO_3$), SBT ($SrBi_2Ta_2O_9$), STO ($SrTiO_3$), BTO ($BaTiO_3$). The ferroelectric substance includes PZT ($PbZrTiO_3$) and PLZT. Employing the thin film 36 having a high dielectric constant enables forming a small capacitor $C_1$ with a large capacitance. Such a small capacitor reduces the circuit area of the semiconductor chip 11.

The thin film portion 34, which is thinner than the insulation film 32, is located between the third electrode 40 and the substrate 31 and serves as a dielectric having a predetermined dielectric constant. The third electrode 40, the thin film portion 34 and the substrate 31 form the capacitor $C_2$.

As shown in FIG. 3, integrally formed with the electrode layer 38 are a printed pattern 38a connected to the pad (the first input terminal) 13a and a printed pattern 38b connected to the non-inverted input terminal of the operational amplifier 21.

As shown in FIG. 4, a passivation film 41, which serves as an insulating protection film for covering the entire surface of the device, is formed on the substrate 31. The passivation film 41 is formed through CVD or the like and made of nitride film (SiN).

The capacitor $C_2$ compensates for phase difference between signal inputted into the inverted input terminal of the operational amplifier 21 and signal inputted into the non-inverted input terminal of the operational amplifier 21. Forming the capacitor $C_1$ having the high dielectric thin film 36 as a filter for the operational amplifier 21 forms a parasitic capacitor (the capacitor $C_3$). The parasitic capacitor consists of the first electrode 35 of the capacitor $C_1$, the substrate 31, the insulation film 32 (the thin film portion 33). The parasitic capacitor causes phase difference between signals that are inputted into the operational amplifier 21. The phase difference may cause the operational amplifier 21 to malfunction. The capacitor $C_2$, which consists of the third electrode 40, the substrate 31 and the thin film 34 is connected to an input terminal (the non-inverted terminal) of the amplifier 21, to which the parasitic capacitor is not connected. The capacitor $C_2$ has the substantially same capacitance as that of the capacitor $C_3$. Forming the capacitor $C_2$ compensates for the phase difference between inputted signals.

The thin film portions 33, 34, which form a part of the capacitors $C_2$, $C_3$, respectively, have the same thickness and area so that the capacitances of the capacitors $C_2$, $C_3$ become substantially equal. More specifically, the relatively narrow second electrode 39 and the relatively wide third electrode 40 are integrally formed with a connecting part 38c in between. If the first electrodes 35 and the electrode layer 38 are formed on the insulation film 32 without the thin film portions 33, 34, the connecting part 38c and the traces 38a, 38b will cause the capacitances of the capacitors $C_2$, $C_3$ to be different from each other. In this embodiment, the thickness and the area of the thin film portions 33, 34 are substantially equal to each other. Therefore, the capacitances of the capacitors $C_2$, $C_3$ are not affected by the connecting part 38c and the traces 38a, 38b. This allows the capacitances of the capacitors $C_2$, $C_3$ to be substantially the same. In other words, adjusting the area of the thin film portions 33, 34 controls the capacitances of each capacitor $C_2$, $C_3$.

Although only one embodiment of the present invention has been described herein, it should be apparent to those skilled in the art that the present invention may be embodied in many other specific forms without departing from the spirit or scope of the invention. Particularly, it should be understood that the invention may be embodied in the following forms.

Instead of in the operational amplifier 21, the present invention may be employed in other types of electronic circuits such as a micro computer, a comparator, a transmitter circuit and a receiver circuit that include various types of elements .

Silicon dioxide ($SiO_2$) may be employed as the interlayer insulation film 37 instead of silicon nitride (SiN).

Ruthenium dioxide ($RuO_2$) or titanium dioxide ($TiO_2$) may be employed for forming the first electrode 35 instead of platinum. Using $RuO_2$ improves the crystallization of BST compared with the case in which the $TiO_2$ is used.

Therefore, the present examples and embodiments are to be considered to as illustrative and not restrictive and the invention is not to be limited to the details given herein, but may be modified within the scope and equivalence of the appended claims.

What is claimed is:

1. A semiconductor device incorporating an electronic circuit having at least two input terminals, comprising:

a semiconductor substrate;

an insulation film formed over said semiconductor substrate;

a first electrode formed over said insulation film;

a high dielectric thin film formed over said first electrode; and a second electrode formed over said high dielectric thin film, said first electrode, said high dielectric thin film and said second electrode forming a first capacitor, said first electrode, said insulation film and said semiconductor substrate forming a parasitic capacitor, said first and second electrodes being respectively connected to said at least two input terminals of said electronic circuit;

wherein said second electrode is further formed over said insulation, said second electrode, said insulation film and said semiconductor substrate forming a second capacitor.

2. The device according to claim 1 wherein the capacitance of said second capacitor is substantially equal to that of said parasitic capacitor.

3. The device according to claim 1 wherein said first capacitor is located in the vicinity of said at least two input terminals of said electronic circuit.

4. The device according to claim 1 wherein said electronic circuit includes an operational amplifier having a non-inverted input terminal and an inverted input terminal, and said first and second electrodes are connected to said non-inverted input terminal and said inverted input terminal, respectively.

5. The device according to claim 1 wherein said insulation film includes a first thin film portion formed at a location corresponding to said first electrode and a second thin film portion formed at a location corresponding to said third electrode, and wherein the thickness and the area of said first and second thin film portions are substantially the same.

6. A semiconductor device incorporating an electronic circuit having at least two input terminals, comprising:

a semiconductor substrate;

a first insulation film formed over said semiconductor substrate;

a first electrode formed over said insulation film;

a second insulation film formed over said first electrode; and a second electrode formed over said second insulation film, said first electrode, said second insulation film and said second electrode forming a first capacitor, said first electrode, said first insulation film and said semiconductor substrate forming a parasitic capacitor, said first and second electrodes being respectively connected to said at least two input terminals of said electronic circuit;

wherein said second electrode is further formed over said first insulation film, said second electrode, said first insulation film and said semiconductor substrate forming a second capacitor.

7. A device according to claim 6 wherein the capacitance of said second capacitor is substantially equal to that of said parasitic capacitor.

8. The device according to claim 6 wherein said first capacitor is located in the vicinity of said at least two input terminals of said electronic circuit.

9. The device according to claim 6 wherein said electronic circuit includes an operational amplifier having a non-inverted input terminal and an inverted input terminal, and said first and second electrodes are connected to said non-inverted input terminal and said inverted input terminal, respectively.

10. The device according to claim 6 wherein said first insulation film includes a first thin film portion formed at a location corresponding to said first electrode and a second thin film portion formed at a location corresponding to said third electrode, and wherein the thickness and the area of said first and second thin film portions are substantially the same.

* * * * *